United States Patent [19]
Yeow et al.

[11] Patent Number: 5,899,759
[45] Date of Patent: May 4, 1999

[54] ELECTRICAL CONNECTOR FOR RIGID CIRCUIT BOARDS

[75] Inventors: Yew Thye Yeow, Canton, Mich.;
Cuong Van Pham, Friendswood, Tex.

[73] Assignee: Ford Motor Company, Dearborn, Mich.

[21] Appl. No.: 08/999,156

[22] Filed: Dec. 29, 1997

[51] Int. Cl.⁶ .................................................. H01R 9/09
[52] U.S. Cl. ............................................ 439/79; 439/876
[58] Field of Search .............................. 439/78, 79, 80, 439/83, 876, 951

[56] References Cited

U.S. PATENT DOCUMENTS

| | | | |
|---|---|---|---|
| 4,037,898 | 7/1977 | Guyette | 439/78 |
| 4,056,302 | 11/1977 | Braun et al. | 339/275 B |
| 4,598,972 | 7/1986 | Mullen, III et al. | 439/876 |
| 4,867,691 | 9/1989 | Eck | 439/876 |
| 4,979,903 | 12/1990 | Gosselin | 439/78 |
| 4,991,666 | 2/1991 | Septfons et al. | 439/79 |
| 5,015,206 | 5/1991 | Dennis | 479/876 |
| 5,261,989 | 11/1993 | Ueltzen | 156/252 |
| 5,310,367 | 5/1994 | Seidler | 439/876 |
| 5,344,343 | 9/1994 | Seidler | 439/876 |
| 5,411,420 | 5/1995 | Dennis | 439/876 |
| 5,441,430 | 8/1995 | Seidler | 439/876 |
| 5,462,443 | 10/1995 | Kurbjuhn et al. | 439/78 |
| 5,569,056 | 10/1996 | Raimond | 439/83 |
| 5,609,490 | 3/1997 | Beesch et al. | 439/79 |
| 5,733,148 | 3/1998 | Kaplan et al. | 439/79 |
| 5,743,751 | 4/1998 | Davis et al. | 439/79 |
| 5,807,126 | 9/1998 | Bethurum | 439/79 |

FOREIGN PATENT DOCUMENTS

| | | | |
|---|---|---|---|
| 1206951 | 8/1959 | France | 439/78 |
| 40 28 105 | 12/1991 | Germany | 439/78 |

*Primary Examiner*—Christopher A. Bennett
*Attorney, Agent, or Firm*—Leslie C. Hodges

[57] ABSTRACT

There is disclosed herein an electrically conductive coupling for connecting an electrical element to a conductive circuit trace on a printed circuit board, comprising: (1) a finger extending outward from an edge of a rigid printed circuit board, wherein the circuit trace terminates on a first surface of the finger; (2) an electrical connector formed from a metal stamping and comprising: a substantially rectotubular barrel portion being dimensioned so as to provide an interference fit with the finger when the finger is inserted therein; an engaging portion being removably connectable with the electrical element; and a transition portion integral with the barrel portion and engaging portion; wherein the finger is connectably inserted into the barrel portion; and (3) a solidified joint of electrically conductive bonding material disposed on the first surface of the finger, such that the joint electrically couples the circuit trace with the barrel portion of the electrical connector.

20 Claims, 3 Drawing Sheets

1

ELECTRICAL CONNECTOR FOR RIGID CIRCUIT BOARDS

BACKGROUND OF THE INVENTION

1. Field of the Invention

The present invention relates generally to electrical connectors. More particularly, the present invention relates to an electrical connector attachable to a rigid printed circuit board.

2. Disclosure Information

In the field of electronics, it is well known to attach plug-in modules, flex circuit wire harnesses, daughter boards, and other surface mount electrical elements 60 to an edge or surface of a rigid printed circuit board (PCB) 50, as illustrated in FIG. 1. This is accomplished by providing either J-lead or gull-wing lead terminations on the electrical elements, surface mounting the elements by registering their terminations on respective solder pasted circuit trace mounting pads, and reflowing the solder paste to form solid solder joints connecting each termination with its respective mounting pad/circuit trace.

However, electrical elements of the type illustrated in FIG. 1 may be subject to repeated engagement and disengagement with wire harnesses, plugs, and other associated members. Additionally, they may also be subject to repeated deflection, flexure, tugging, and other mechanical perturbations transmitted or caused by such associated members. Furthermore, because these elements (and the associated members attached thereto) are typically much larger and more massive than their associated solder joints, vibration and other mechanical disturbances tend to be more damaging to the element's associated solder joints, thus precluding the use of such electrical elements in some applications.

It would be desirable to provide a means for attaching these electrical elements to rigid printed circuit boards without the drawbacks mentioned above.

SUMMARY OF THE INVENTION

The present invention overcomes the disadvantages of the prior art by providing an electrically conductive coupling for connecting an electrical element to a conductive circuit trace on a printed circuit board, comprising: (1) a finger extending outward from an edge of a rigid printed circuit board, wherein the circuit trace terminates on a first surface of the finger; (2) an electrical connector formed from a metal stamping and comprising: a substantially rectotubular barrel portion being dimensioned so as to provide an interference fit with the finger when the finger is inserted therein; an engaging portion being removably connectable with the electrical element; and a transition portion integral with the barrel portion and engaging portion; wherein the finger is connectably inserted into the barrel portion; and (3) a solidified joint of electrically conductive bonding material disposed on the first surface of the finger, such that the joint electrically couples the circuit trace with the barrel portion of the electrical connector.

It is an object and advantage that the present invention provides a more robust mechanical and electrical connection than the conventional approaches mentioned above for connecting an electrical element to a rigid PCB.

It is a further advantage that the electrical connector which comprises a part of the present invention may be easily and economically formed from a metal stamping.

These and other advantages, features and objects of the invention will become apparent from the drawings, detailed description, and claims which follow.

DETAILED DESCRIPTION OF THE PREFERRED EMBODIMENTS

Figure 1:
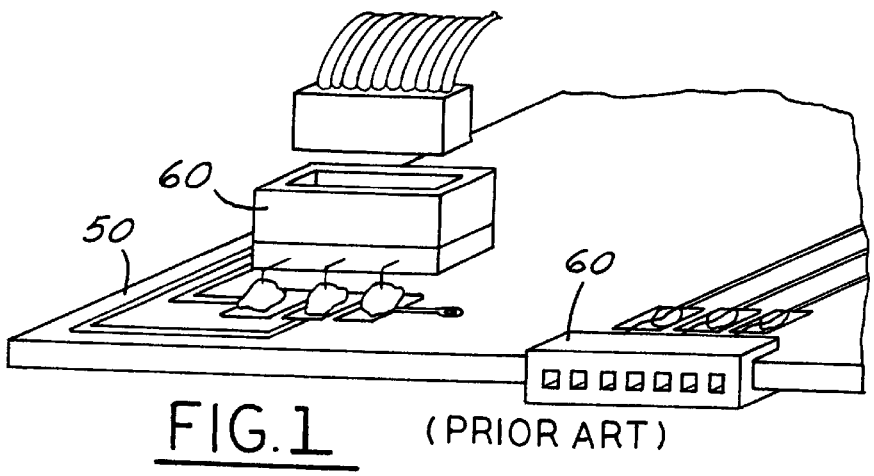
FIG. 1 is a perspective view of edge-mounted and surface-mounted electrical components on a printed circuit board according to the prior art.
Figure 2A:
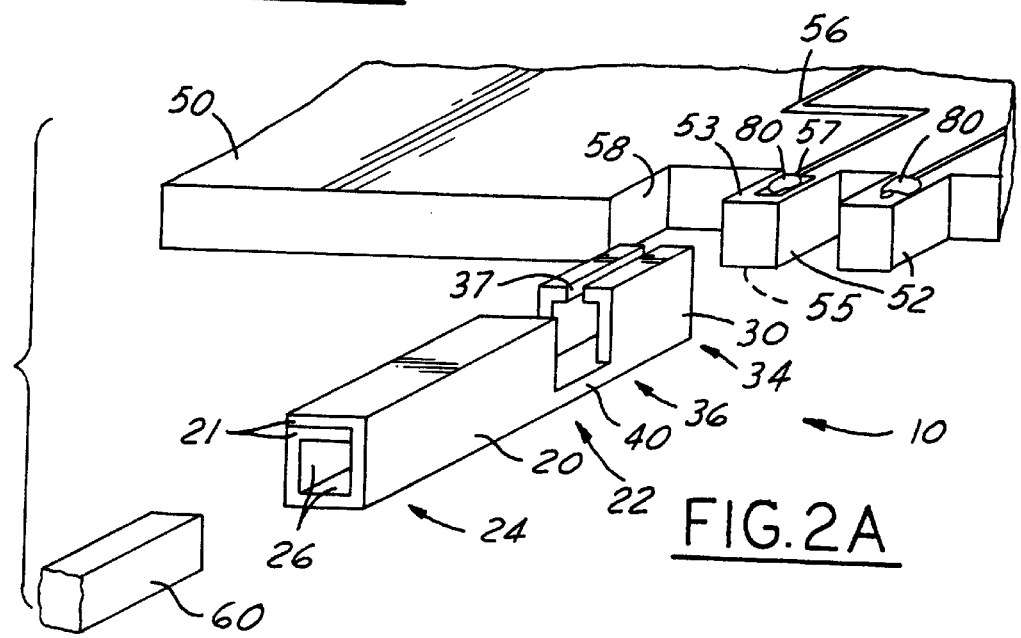
FIGS. 2A–B are exploded and assembled perspective views, respectively, of an electrically conductive coupling according to the present invention.
Figure 2B:
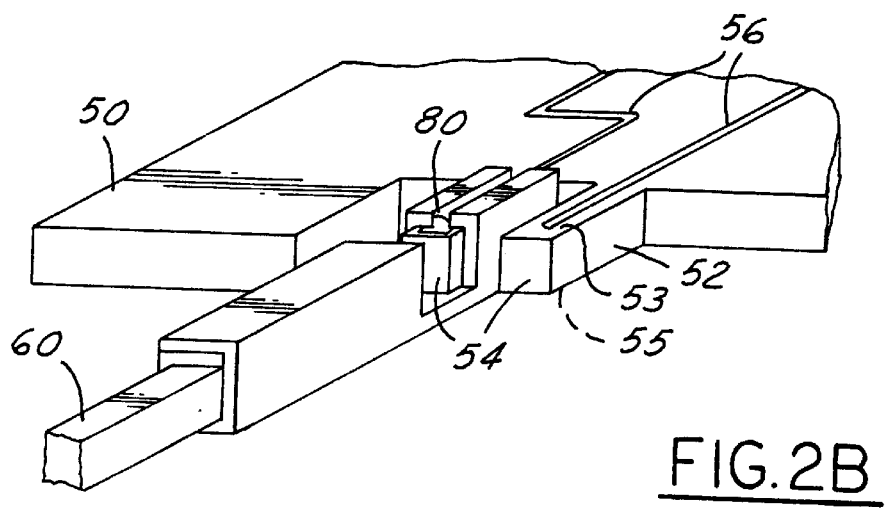

Referring now to the drawings, FIGS. 2A–B show an electrically conductive coupling for connecting an electrical element 60 to a conductive circuit trace 56 on a rigid PCB 50, comprising: (1) a finger 52 extending outward from and being formed along an edge of the PCB 50, wherein the circuit trace 56 terminates on a first surface 53 of the finger 52; (2) an electrical connector 10 formed from a metal stamping and comprising: (2a) a substantially rectotubular barrel portion 30 having a longitudinal axis A, first and second open ends 34/36, a longitudinal slot 37 along the entire length of a first wall 38 thereof, a second wall 33 opposing the first wall 38, and a generally longitudinal trough 31 along the interior surface 39 of the second wall 33 extending from the first open end 34 to substantially the second open end 36, wherein the barrel portion 30 has predetermined interior width and height dimensions W/H selected so as to provide an interference fit between the finger 52 and interior wall surfaces 39 of the barrel portion 30 when the finger is inserted into the first open end 34; (2b) an engaging portion 20 having third and fourth ends 22/24 wherein the fourth end 24 is removably connectable with the electrical element 60; and (2c) a transition portion 40 integral with the second wall 33 of the barrel portion at the second end 36 thereof and with the third end 22 of the engaging portion; wherein the finger 52 is connectably inserted into the barrel portion 30; and (3) a solidified joint 80 of electrically conductive bonding material disposed on the first surface 53 of the finger 52, such that the joint 80 electrically couples the circuit trace 56 with the barrel portion 30 of the electrical connector 10.

As can be seen in FIGS. 2A–B, the finger 52 is integral with the PCB 50 and may be formed by sawing, punching, etching, or otherwise producing slots 58 along the PCB edge so as to produce fingers 52 having the rectangular profile shown. Typically the forming of the fingers 52 is done first, followed by the forming of the circuit traces 56 thereon by such processes as plating, etching, and the like. A circuit trace 56 is produced on at least a first surface 53 of the finger 52, wherein the first surface is within either of the two facial planes of the PCB (i.e., within either of the two board surfaces onto which conventional surface mount components are typically attached); however, it is likewise possible that an additional circuit trace is produced on a second surface 55 within the other facial plane. The circuit trace(s) 56 on each finger 52 may optionally terminate in a mounting pad 57, as shown in FIG. 2, with solder paste 80 or some other electrically conductive bonding material deposited on the mounting pad or the terminal portion of the circuit trace prior to insertion of the barrel portion over the finger. Once the electrical connectors 10 are fitted over their respective solder pasted fingers 52—and the various surface mount components have been registered atop their respective solder pasted mounting pads on the PCB surfaces 53/53—the entire PCB may be passed through a reflow oven or other means for melting, reflowing, and solidifying the solder into solid solder joints.

Figure 3:
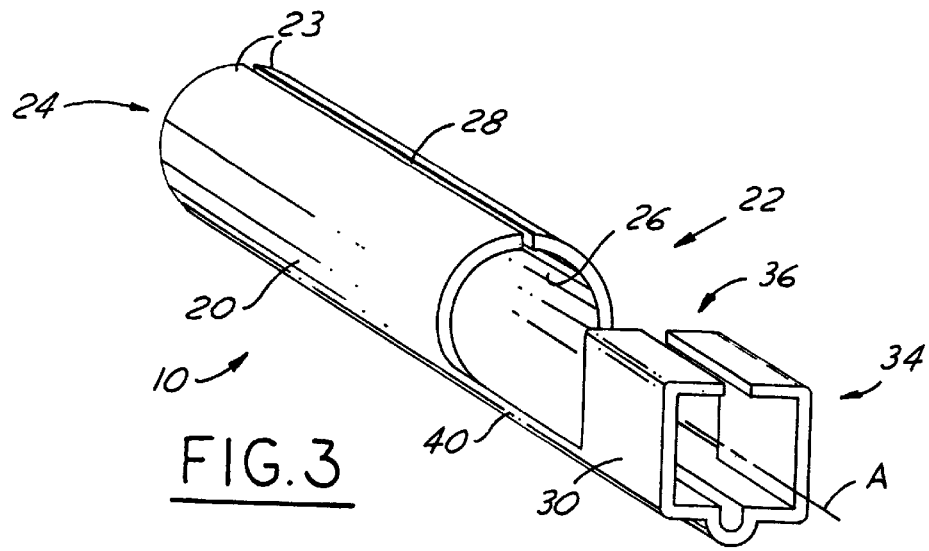
FIG. 3 is a perspective view of an electrical connector according to the present invention.
Figure 4:
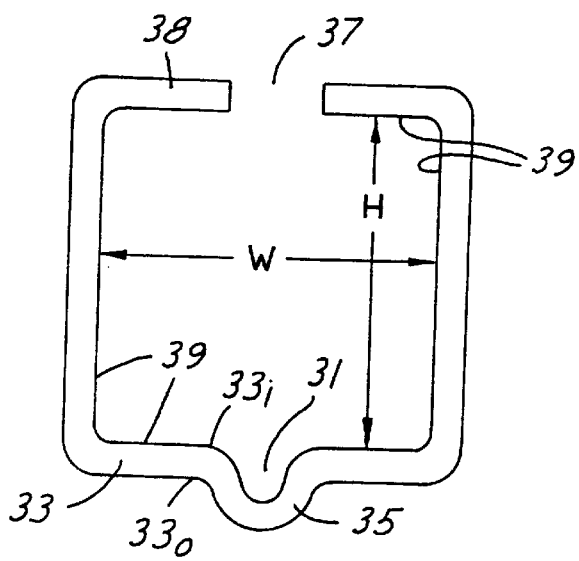
FIG. 4 is an end view of a barrel portion of an electrical connector according to the present invention.

The barrel portion 30 has a rectangular tubular (i.e., rectotubular) profile as illustrated in FIGS. 2A–B and 3 and more particularly in FIG. 4. This profile, along with the predetermined interior width and height dimensions W/H, are selected so as to provide an interference fit with the rectangular-profiled finger 52 when the finger is inserted into the first open end 34 of the barrel portion 30. The longitudinal slot 37 is provided in the first wall 38 in order to allow the barrel portion to expand outward about the finger as it is inserted therein, thereby causing the barrel portion to compressively grip the finger. In order to facilitate registration of the finger 52 with (and entry of the finger into) the barrel portion first open end 34, the barrel portion may be tapered such that the first open end 34 is wider than the second open end 36.

Also provided on the barrel portion is a generally longitudinal trough 31 along the interior surface of the second wall 33. This trough 31 extends from the first open end 34 to substantially the second open end 36, and is provided in order to reduce the likelihood that the second wall 33 might scrape away solder paste from off of the circuit trace/mounting pad 56/57 when the connector 10 is inserted onto the finger 52. The trough 31 may be formed by scoring or pressing the second wall interior surface 33i during the metal stamping process without producing a corresponding longitudinal promontory on the second wall outer surface 33o, or, preferably, the second wall 33 may include a generally longitudinal, outwardly protruding crease 35 in outer surface 33o extending from the first open end 34 to substantially the second open end 36 so as to define the trough 31 on the interior surface 33i.

The barrel and transition portions 30/40 may be dimensioned so that the distance from the first end 34 to the third end 22 is larger than the length of the finger 52 extending from the PCB 50. In such an arrangement, when the finger is fully inserted into the barrel portion, the tip 54 of the finger 52 will extend beyond the second open end 22 but not quite into contact with the third end 22 of the engaging portion.

The engaging portion 20 has a third end 22 integral with the transition portion 40 and a fourth end 24 distal therefrom, wherein the fourth end 24 is removably connectable with the electrical element 60. Either of two connection configurations are contemplated: (1) the electrical element 60 may comprise a female connector—e.g., a socket, receptacle, jack, hole, ring, etc.—with the fourth end 24 of the engaging portion 20 comprising a mating male connector—e.g., a pin, plug, prong, fork, tine, finger, lead, termination, etc.—as illustrated in FIG. 6; or, vice versa, (2) the electrical element 60 may comprise a male connector while the fourth end 24 comprises a mating female connector, as represented in FIGS. 2A–5. In either configuration, the male and female connectors are dimensioned so as to provide an interference fit therebetween when connected together.

In the second configuration, the engaging portion 20 may be substantially tubular in construction with the third and fourth ends 22/24 thereof comprising third and fourth open ends, respectively, as represented by the generally rectangular tube shape of FIGS. 2A–B and the generally round tube shape of FIG. 3. The tubular shape may be formed during the metal stamping process to provide overlapping edges 21 as illustrated in FIGS. 2A–B, or substantially abutted edges 23 with an optional longitudinal slot 28 along substantially the entire length of the engaging portion as illustrated in FIG. 3.

Figure 5:
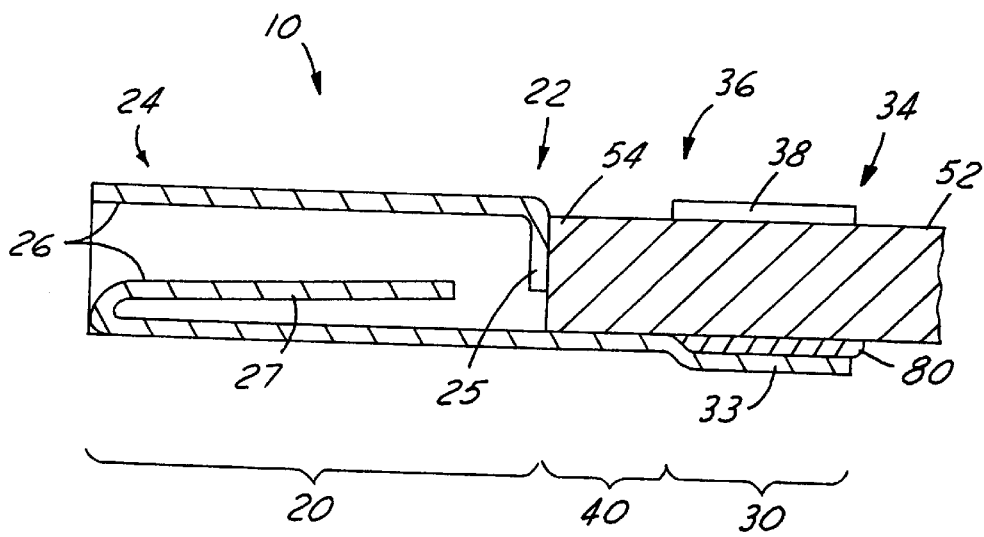
FIG. 5 is an elevational section view of an electrical connector according to another configuration of the present invention.
Figure 6:
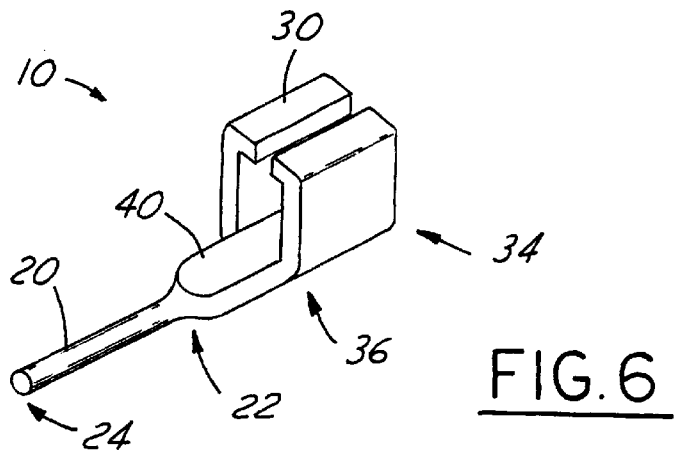
FIG. 6 is a perspective view of an electrical connector according to yet another configuration of the present invention.

The substantially tubular engaging portion configuration may further include an inwardly extending cantilever spring portion 27 integral with the fourth open end 24 as illustrated in FIG. 5, such that the cantilever spring portion 27 and interior walls 26 of the engaging portion together provide an interference fit with the male connector of the electrical element 60. As also shown in FIG. 5, the engaging portion may further include a generally lateral wall segment 25 descending inwardly from the third open end 22, such that a tip 54 of the finger 52 may contact the lateral wall segment 25 when the finger 52 is inserted into and through the barrel portion 30.

When the finger 52 is connectably inserted into the barrel portion 30, the connector/barrel may be oriented with respect to the finger/PCB such that either the trough 31 in the second wall 33 or the slot 37 in the first wall 38 substantially straddles the circuit trace 56 on the first surface 53 of the finger 52; if circuit traces are disposed on both the first and second surfaces 53/55 of the finger, then both the trough 31 and the slot 37 will substantially straddle a respective circuit trace. In either case, the trough 31 and/or slot 37 provide a relief in the respective wall 33/38 of the barrel portion 30 so that any tendency the barrel might have of scraping off solder paste during insertion is reduced.

Figures 7A, 7B:
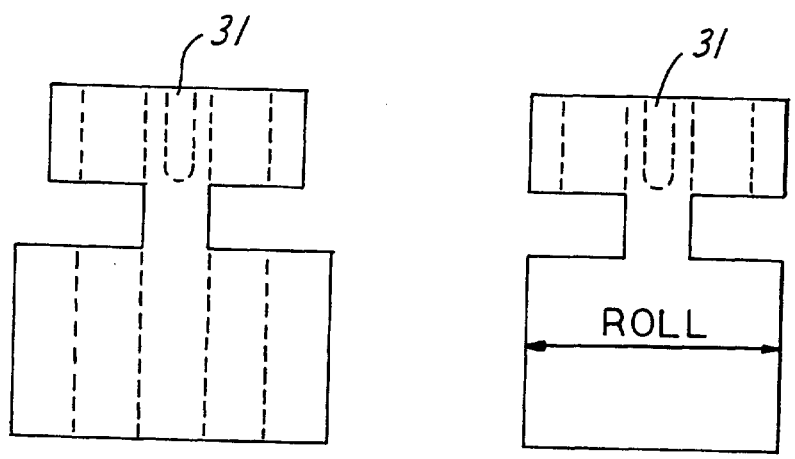
FIGS. 7A–C are plan views of stampings used to make electrical connectors according to the present invention as shown in FIGS. 2, 3, and 5, respectively.
Figure 7C:
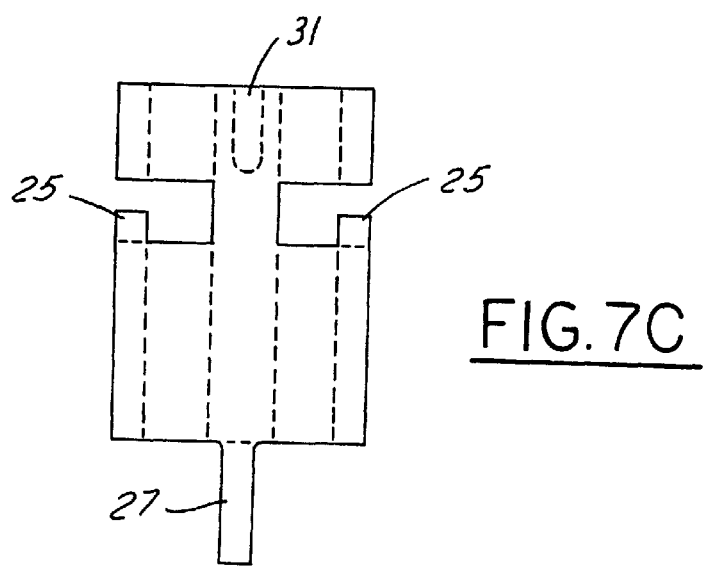

The various connector configurations described may each be easily produced using a metal stamping process. For example, FIGS. 7A–C illustrate the stamped-out blanks and folding lines (represented by dashed lines) which may be used to produce the connectors 10 shown in FIGS. 2, 3, and 5, respectively. While it may be possible to construct certain limited connector configurations according to the present invention using processes other than stamping, such as extrusion plus post-extrusion machining or milling, the preferred process is to use a metal stamping and folding process as described and illustrated herein.

Because individual connectors 10 may be small in size, it may be desired to gang multiple connectors together in a plastic housing, which is a practice well known in the art to which the present invention pertains. Using this approach, multiple connectors 10 may be attached to their respective fingers 52 simultaneously, and multiple electrical elements 60 may simultaneously be attached thereto.

As mentioned above, the present invention provides a means of connecting a surface mount electrical element 60 to a circuit trace 56 on a rigid PCB 50 having a more robust mechanical and electrical connection. As can be appreciated form the foregoing description, the present invention provides such a connection which provides more protection to the solder joint against flexure, vibration, and other static and dynamic perturbations, since the transition portion 40 and other portions of the connector 10 distribute and minimize the damaging effect of such disturbances such that the solder joint bears less of these affronts than is the case with conventional surface mount solder joints. Furthermore, the present invention also provides the advantage that the solder joint may be desoldered if desired in order to effect repair, rework, rerouting, etc.

Various other modifications to the present invention will, no doubt, occur to those skilled in the art to which the present invention pertains. For example, although the connectors 10 illustrated in the drawings show barrel portions 20 being substantially collinear with their respective engaging portions 20, it is preferred but not required that this be the case for all applications. Also, the mating male and female connector portions of the electrical element 60 and engaging portion fourth end 24 may include one or more mechanical detents on at least one of the male and female connector portions. It is the following claims, including all equivalents, which define the scope of the present invention.

What is claimed is:

1. An electrical connector for connecting an electrical element to a circuit trace termination on an outwardly extending finger formed along an edge of a rigid printed circuit board, said connector being formed from a metal stamping and comprising:
   a substantially rectotubular barrel portion having a longitudinal axis, first and second open ends, a longitudinal slot along the entire length of a first wall thereof, a second wall opposing said first wall, and a generally longitudinal trough along the interior surface of said second wall extending from said first open end to substantially said second open end, wherein said barrel portion has predetermined interior width and height dimensions selected so as to provide an interference fit between the finger of the printed circuit board and interior wall surfaces of said barrel portion when the finger is inserted into said first open end;
   an engaging portion having third and fourth ends wherein said fourth end is removably connectable with the electrical element; and
   a transition portion integral with said second wall of said barrel portion at said second end thereof and with said third end of said engaging portion.

2. An electrical connector according to claim 1, wherein said second wall includes a generally longitudinal, outwardly protruding crease extending from said first open end to substantially said second open end so as to define the trough on the interior surface of said second wall.

3. An electrical connector according to claim 1, wherein said barrel portion is tapered such that said first open end is wider than said second open end.

4. An electrical connector according to claim 1, wherein the distance from said first end to said third end is larger than the length of the finger extending from the printed circuit board.

5. An electrical connector according to claim 1, wherein said electrical element comprises a female connector and said fourth end of said engaging portion comprises a male connector removably connectable with the electrical element.

6. An electrical connector according to claim 5, wherein said male and female connectors are dimensioned so as to provide an interference fit therebetween when connected together.

7. An electrical connector according to claim 1, wherein said electrical element comprises a male connector and said fourth end of said engaging portion comprises a female connector removably connectable with the electrical element.

8. An electrical connector according to claim 7, wherein said male and female connectors are dimensioned so as to provide an interference fit therebetween when connected together.

9. An electrical connector according to claim 7, wherein said engaging portion is substantially tubular and wherein said third and fourth ends of said engaging portion comprise third and fourth open ends thereof, respectively.

10. An electrical connector according to claim 7, wherein said engaging portion has a longitudinal slot along substantially the entire length thereof.

11. An electrical connector according to claim 9, wherein said engaging portion includes an inwardly extending cantilever spring portion integral with said fourth open end, such that said cantilever spring portion and interior walls of said engaging portion provide an interference fit with the electrical element.

12. An electrical connector according to claim 9, wherein said engaging portion includes a generally lateral wall segment descending inwardly from said third open end, such that a tip of the finger may contact said lateral wall segment when the finger is inserted through said barrel portion.

13. An electrical connector for connecting an electrical element having a male connector thereon to a circuit trace termination on an outwardly extending finger formed along an edge of a rigid printed circuit board, said connector being formed from a metal stamping and comprising:
   a substantially rectotubular barrel portion having a longitudinal axis, first and second open ends, a longitudinal slot along the entire length of a first wall thereof, a second wall opposing said first wall, and a generally longitudinal trough along the interior surface of said second wall extending from said first open end to substantially said second open end, wherein said barrel portion has predetermined interior width and height dimensions selected so as to provide an interference fit between the finger of the printed circuit board and interior wall surfaces of said barrel portion when the finger is inserted into said first open end;
   an engaging portion having third and fourth open ends wherein said fourth end comprises a female connector removably connectable with the male connector of the electrical element; and
   a transition portion integral with said second wall of said barrel portion at said second end thereof and with said third end of said engaging portion;
   wherein the male connector of the electrical element and said female connector of said engaging portion are dimensioned so as to provide an interference fit therebetween when connected together.

14. An electrical connector according to claim 13 wherein said engaging portion is substantially tubular and includes an inwardly extending cantilever spring portion integral with said fourth open end, such that said cantilever spring portion and interior walls of said engaging portion provide an interference fit with the electrical element.

15. An electrical connector according to claim 13 wherein said engaging portion is substantially tubular and includes a generally lateral wall segment descending inwardly from said third open end, such that a tip of the finger may contact said lateral wall segment when the finger is inserted through said barrel portion.

16. An electrical connector according to claim 13, wherein said second wall includes a generally longitudinal, outwardly protruding crease extending from said first open end to substantially said second open end so as to define the trough on the interior surface of said second wall.

17. An electrically conductive coupling for connecting an electrical element to a conductive circuit trace on a printed circuit board, comprising:
   a finger extending outward from and being formed along an edge of a rigid printed circuit board, wherein the circuit trace terminates on a first surface of said finger;

an electrical connector formed from a metal stamping and comprising:
- a substantially rectotubular barrel portion having a longitudinal axis, first and second open ends, a longitudinal slot along the entire length of a first wall thereof, a second wall opposing said first wall, and a generally longitudinal trough along the interior surface of said second wall extending from said first open end to substantially said second open end, wherein said barrel portion has predetermined interior width and height dimensions selected so as to provide an interference fit between said finger and interior wall surfaces of said barrel portion when said finger is inserted into said first open end;
- an engaging portion having third and fourth ends wherein said fourth end is removably connectable with the electrical element; and
- a transition portion integral with said second wall of said barrel portion at said second end thereof and with said third end of said engaging portion;

wherein said finger is connectably inserted into said barrel portion; and a solidified joint of electrically conductive bonding material disposed on said first surface of said finger, such that said joint electrically couples the circuit trace with said barrel portion of said electrical connector.

18. An electrical connector according to claim 17, wherein said finger is connectably inserted into said barrel portion such that the trough in said second wall or the slot in said first wall substantially straddles the circuit trace on said first surface of said finger.

19. An electrical connector according to claim 17, wherein wherein said electrical element comprises a male connector and said fourth end of said engaging portion comprises a female connector removably connectable with the electrical element, wherein said male and female connectors are dimensioned so as to provide an interference fit therebetween when connected together.

20. An electrical connector according to claim 17, wherein wherein said engaging portion is substantially tubular.

* * * * *